(12) United States Patent
Lee et al.

(10) Patent No.: US 9,837,627 B2
(45) Date of Patent: Dec. 5, 2017

(54) ORGANIC LIGHT EMITTING DIODE HAVING HOLE AUXILIARY LAYER AND ORGANIC LIGHT EMITTING DIODE DISPLAY INCLUDING THE SAME

(71) Applicant: Samsung Display Co., Ltd., Yongin-si (KR)

(72) Inventors: Sang Woo Lee, Hwaseong-si (KR); Ha Jin Song, Hwaseong-si (KR); Heun Seung Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/153,714

(22) Filed: May 12, 2016

(65) Prior Publication Data

US 2017/0141342 A1 May 18, 2017

(30) Foreign Application Priority Data

Nov. 12, 2015 (KR) ........................ 10-2015-0158690

(51) Int. Cl.
*H01L 29/08* (2006.01)
*H01L 21/00* (2006.01)
*H01L 51/50* (2006.01)
*H01L 27/32* (2006.01)
(Continued)

(52) U.S. Cl.
CPC ...... *H01L 51/5064* (2013.01); *H01L 27/3248* (2013.01); *H01L 27/3262* (2013.01); *H01L 51/5004* (2013.01); *H01L 51/5056* (2013.01); *H01L 51/5096* (2013.01); *H01L 27/1214* (2013.01); *H01L 51/0061* (2013.01); *H01L 51/0072* (2013.01); *H01L 51/0073* (2013.01); *H01L 51/0074* (2013.01); *H01L 51/0081* (2013.01); *H01L 51/0085* (2013.01); *H01L 51/0087* (2013.01); *H01L 51/5016* (2013.01); (Continued)

(58) Field of Classification Search
CPC ............ H01L 51/5064; H01L 27/3248; H01L 27/3262; H01L 51/5096; H01L 51/5056
See application file for complete search history.

(56) References Cited

U.S. PATENT DOCUMENTS 7,432,648 B2 * 10/2008 Lee ..................... H01L 51/5234
313/504
7,667,388 B2 2/2010 Ryu
7,897,270 B2 3/2011 Kim et al.
(Continued)

FOREIGN PATENT DOCUMENTS

KR 10-0721554 5/2007
KR 10-1261602 5/2013
(Continued)

*Primary Examiner* — Alonzo Chambliss
(74) *Attorney, Agent, or Firm* — H.C. Park & Associates, PLC

(57) ABSTRACT

An organic light emitting element according to an exemplary embodiment of the present invention includes a first electrode; a second electrode; an emission layer between the first electrode and the second electrode; and a hole auxiliary layer between the first electrode and the emission layer. The hole auxiliary layer includes at least one hole blocking layer and at least one hole transport layer contacting the hole blocking layer, and a thickness of the hole auxiliary layer is in a range of 140 angstroms to 220 angstroms.

20 Claims, 10 Drawing Sheets

(51) Int. Cl.
*H01L 27/12* (2006.01)
*H01L 51/00* (2006.01)

(52) U.S. Cl.
CPC .. *H01L 2251/552* (2013.01); *H01L 2251/558* (2013.01)

(56) References Cited

U.S. PATENT DOCUMENTS

| | | | |
|---|---|---|---|
| 9,172,055 B2 | 10/2015 | Kim et al. | |
| 9,214,497 B2 | 12/2015 | Park et al. | |
| 2005/0012455 A1* | 1/2005 | Lee | H01L 51/5234 313/506 |
| 2007/0013282 A1* | 1/2007 | Okutani | H01L 27/322 313/111 |
| 2010/0051925 A1* | 3/2010 | Kho | H01L 51/5036 257/40 |
| 2011/0062427 A1* | 3/2011 | Jeong | H01L 51/5036 257/40 |
| 2013/0313535 A1* | 11/2013 | Heo | H01L 51/5064 257/40 |
| 2014/0225079 A1* | 8/2014 | Lee | H01L 51/0072 257/40 |
| 2015/0137083 A1* | 5/2015 | Cheng | H01L 51/0059 257/40 |
| 2016/0181560 A1* | 6/2016 | Yamamoto | H01L 51/504 257/40 |
| 2016/0351826 A1* | 12/2016 | Kim | C07D 495/04 |

FOREIGN PATENT DOCUMENTS

| | | |
|---|---|---|
| KR | 10-2014-0001581 | 1/2014 |
| KR | 10-2014-0062401 | 5/2014 |

* cited by examiner

ORGANIC LIGHT EMITTING DIODE HAVING HOLE AUXILIARY LAYER AND ORGANIC LIGHT EMITTING DIODE DISPLAY INCLUDING THE SAME

CROSS-REFERENCE TO RELATED APPLICATION

This application claims priority from and the benefit of Korean Patent Application No. 10-2015-0158690, filed on Nov. 12, 2015, which is hereby incorporated by reference for all purposes as if fully set forth herein.

BACKGROUND

Field

Exemplary embodiments relate to electronic devices, more particularly, to an organic light emitting element and an organic light emitting diode display including the same.

Discussion of the Background

Electronic devices, such as mobile phones, notebook computers, personal digital assistants, tablets, and so on are widely used. These devices typically include a display to provide users with visual information, such as an image or video information, in order to support various functions.

A liquid crystal display requires an additional element to provide backlight because the liquid crystal display cannot emit light by itself. The liquid crystal display lags in response speed and its viewing angle is narrow. An organic light emitting diode display is a self-emitting display element and does not require the additional element to emit light. Further, the organic light emitting diode display provides a wider viewing angle, excellent contrast, and a fast response time.

The organic light emitting diode display includes an organic light emitting element. The organic light emitting element includes two electrodes and an emission layer between the two electrodes. Electrons injected from one electrode into the emission layer and holes injected from the other electrode into the emission layer may be combined to form excitons and emit light when releasing energy.

The above information disclosed in this Background section is only for enhancement of understanding the background of the inventive concept, and, therefore, it may contain information that does not form the prior art that is already known in this country to a person of ordinary skill in the art.

SUMMARY

Exemplary embodiments provide an organic light emitting element having improved current efficiency and lifespan, and an organic light emitting diode display including the same.

Additional aspects will be set forth in the detailed description which follows, and, in part, will be apparent from the disclosure, or may be learned by practice of the inventive concept.

According to exemplary embodiments, an organic light emitting element includes a first electrode; a second electrode; an emission layer between the first electrode and the second electrode; and a hole auxiliary layer between the first electrode and the emission layer. The hole auxiliary layer includes at least one hole blocking layer and at least one hole transport layer contacting the hole blocking layer, and the thickness of the hole auxiliary layer is in a range of 140 angstroms to 220 angstroms.

The hole auxiliary layer may include a multi-layered structure consisting of more than three layers, in which the hole blocking layer and the hole transport layer are alternately positioned.

The hole auxiliary layer may include two hole blocking layers as the at least one hole blocking layer, and the at least one hole transport layer may be positioned between the two hole blocking layers.

The thickness of each of the at least one hole blocking layer may be in the range of 30 angstroms to 60 angstroms.

The thickness of each of the at least one hole transport layer may be in the range of 30 angstroms to 120 angstroms.

An energy level of a highest occupied molecular orbital (HOMO) of the at least one hole blocking layer may be lower than the energy level of the highest occupied molecular orbital of the at least one hole transport layer.

An energy level of the highest occupied molecular orbital of the at least one hole blocking layer may be lower than the energy level of the highest occupied molecular orbital of the emission layer.

An energy level of the highest occupied molecular orbital of the at least one hole blocking layer may be higher than the energy level of the highest occupied molecular orbital of the emission layer.

An energy level of a lowest unoccupied molecular orbital (LUMO) of the at least one hole blocking layer may be higher than the energy level of the lowest unoccupied molecular orbital of the emission layer.

The hole auxiliary layer may include two hole transport layers as the at least one hole transport layers, and the at least one hole blocking layer may be positioned between the two hole transport layers.

According to exemplary embodiments, an organic light emitting diode display includes a substrate; a transistor positioned on the substrate; and an organic light emitting element connected to the transistor, wherein the organic light emitting element includes a first electrode, a second electrode, an emission layer between the first electrode and the second electrode, and a hole auxiliary layer between the first electrode and the emission layer. The hole auxiliary layer includes at least one hole blocking layer and at least one hole transport layer contacting the hole blocking layer, and the thickness of the hole auxiliary layer is in a range of 140 angstroms to 220 angstroms.

The hole auxiliary layer may include a multi-layered structure of more than three layers, in which the hole blocking layer and the hole transport layer are alternately positioned.

The hole auxiliary layer may include two hole blocking layers as the at least one hole blocking layer, and the at least one hole transport layer may be positioned between the two hole blocking layers.

The thickness of each of the at least one hole blocking layer may be in the range of 30 angstroms to 60 angstroms.

The thickness of each of the at least one hole transport layer may be in the range of 30 angstroms to 120 angstroms.

An energy level of a highest occupied molecular orbital (HOMO) of the at least one hole blocking layer may be lower than the energy level of the highest occupied molecular orbital of the at least one hole transport layer.

An energy level of the highest occupied molecular orbital of the at least one hole blocking layer may be lower than the energy level of the highest occupied molecular orbital of the emission layer.

An energy level of the highest occupied molecular orbital of the at least one hole blocking layer may be higher than the energy level of the highest occupied molecular orbital of the emission layer.

An energy level of a lowest unoccupied molecular orbital (LUMO) of the at least one hole blocking layer may be higher than the energy level of the lowest unoccupied molecular orbital of the emission layer.

The hole auxiliary layer may include two hole transport layers as the at least one hole transport layers, and the at least one hole blocking layer may be positioned between the two hole transport layers.

According to exemplary embodiments, an organic light emitting element includes a first electrode; a second electrode; an emission layer between the first electrode and the second electrode; and one or more hole blocking layers and one or more hole transport layers alternately stacked between the first electrode and the emission layer. Each of the one or more hole blocking layers has a thickness of between 30 angstroms and 60 angstroms.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
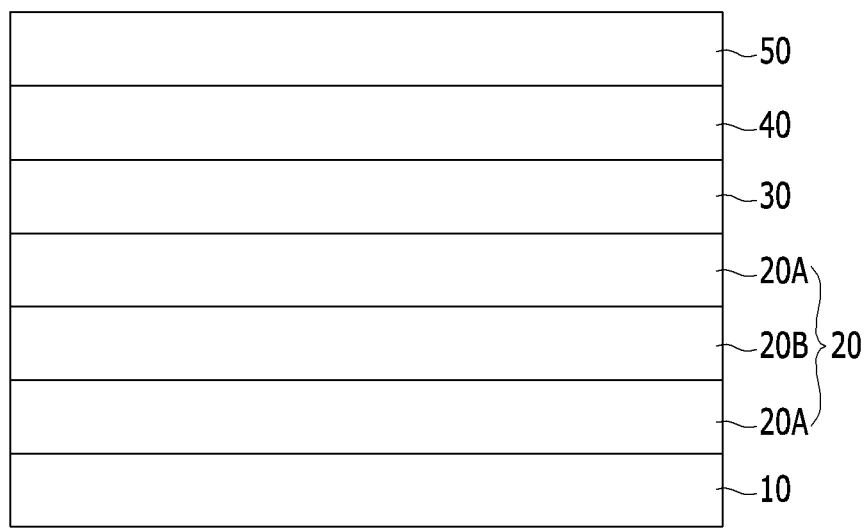
FIG. 1 is a cross-sectional view of an organic light emitting element according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view of an organic light emitting element according to an exemplary embodiment.

Referring to FIG. 1, an organic light emitting element includes a first electrode 10, a second electrode 50 facing the first electrode 10, an emission layer 30 between the first electrode 10 and the second electrode 50, a hole auxiliary layer 20 between the first electrode 10 and the emission layer 30, and an electron transport layer 40 between the emission layer 30 and the second electrode 50.

The first electrode 10 may be an anode, and the second electrode 50 may be a cathode. The first electrode 10 of the anode as an electrode injecting holes to the emission layer 30 may have a high work function, and the second electrode 50 of the cathode as an electrode injecting electrons to the emission layer 30 may have a low work function when a current is supplied. However, it is not limited thereto. For instance, the first electrode may be the cathode and the second electrode may be the anode.

In one or more exemplary embodiments, the first electrode 10 may be a transparent electrode or a non-transparent electrode.

In one or more exemplary embodiments, the transparent electrode may include a conductive oxide, such as, indium tin oxide (ITO), indium zinc oxide (IZO), tin oxide ($SnO_2$), zinc oxide (ZnO), or combinations thereof, or may include a metal, such as, aluminum, silver, or magnesium having a thin thickness. For example, the transparent electrode may include multi-layers having at least one of the conductive oxide and the metal. In one or more exemplary embodiments, the non-transparent electrode may be formed of a metal such as aluminum, silver, or magnesium.

In one or more exemplary embodiments, the first electrode 10 may include a reflective layer made of silver (Ag), aluminum (Al), Magnesium (Mg), chromium (Cr), molybdenum (Mo), tungsten (W), titanium (Ti), gold (Au), palladium (Pd), or an alloy thereof when the light generated from the emission layer 30 is emitted in the direction from the first electrode 10 to the second electrode 50. Further, the first electrode 10 may be made of a multi-layered structure having the reflective layer and the transparent electrode positioned over and/or under the reflective layer.

In one or more exemplary embodiments, the first electrode 10 may be formed using a sputtering method, a vapor phase deposition method, an ion beam deposition method, an electron beam deposition method, or a laser ablation method.

The hole auxiliary layer 20 is positioned between the first electrode 10 and the emission layer 30. The hole auxiliary layer 20 helps the holes to be transmitted from the first electrode 10 to the emission layer 30.

According to an exemplary embodiment, the hole auxiliary layer 20 is in a range of about 140 angstroms (Å) to 220 angstroms (Å) thick. The organic light emitting element may be too thick when the hole auxiliary layer 20 is thicker than 220 angstroms. Hole auxiliary layer 20 thinner than 140 angstroms may overdose the hole injection and crumbles a charge balance in the emission layer 30, deteriorating current efficiency. In this case, it may be difficult to provide the color by the organic light emitting element.

The hole auxiliary layer 20 includes at least one hole blocking layer 20A and at least one hole transport layer 20B contacting the hole blocking layer 20A. In an exemplary embodiment shown in FIG. 1, the hole auxiliary layer 20 may include two hole blocking layers 20A and a hole transport layer 20B between the two hole blocking layers 20A. However, its structure and composition are not limited thereto. In one or more exemplary embodiments, the hole auxiliary layer 20 may include an even number of hole blocking layers 20A and an odd number of hole transport layers 20B, and the hole blocking layers 20A and the hole transport layers 20B are alternately positioned. Two of the hole blocking layers 20A may be outer layers among the hole blocking layers 20A and the hole transport layers 20B. In one or more exemplary embodiments, the hole auxiliary layer 20 may include a multi-layered structure having three or more of the hole blocking layers 20A and the hole transport layers 20B which are alternately positioned. In one or more exemplary embodiments, the hole auxiliary layer 20 may include single hole blocking layer and single hole transport layer.

The hole blocking layer 20A controls the transmission of the holes injected from the first electrode 10. The hole blocking layer 20A may prevent the holes from being excessively injected from the first electrode 10 to the emission layer 30 even though the thickness of the hole auxiliary layer 20 is thin, thereby adjusting the charge balance in the emission layer 30.

The thickness of the hole blocking layer 20A may be in the range of about 30 angstroms to 60 angstroms. When the hole blocking layer 20A is thinner than 30 angstroms, the holes from the first electrode 10 can just pass through the hole blocking layer 20A. The hole blocking layer 20A thicker than 60 angstroms, may significantly decrease efficiency (for example, conversion efficiency) transporting the holes to the emission layer 30 by excessively blocking the hole transmission. According to an exemplary embodiment of the present invention, each hole blocking layer 20A may be between 30 angstroms to 60 angstroms thick.

In one or more exemplary embodiments, the hole blocking layer 20A may include a compound represented by Chemical Formula 1.

Chemical Formula 1
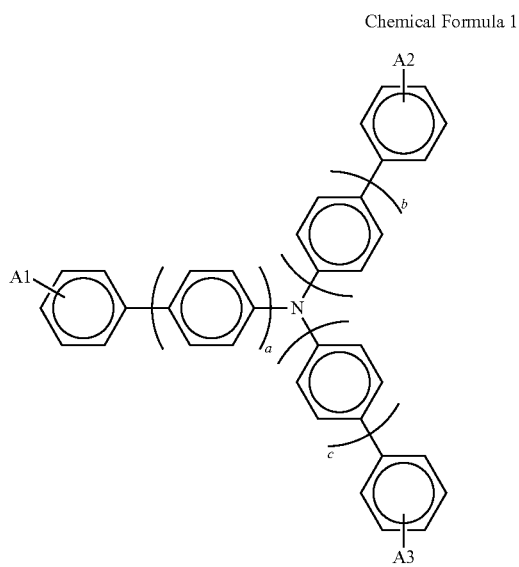
In Chemical Formula 1, A1, A2, and A3 may be an alkyl group, an aryl group, carbazole, dibenzothiophene, dibenzofuran (DBF), or biphenyl, and a, b, and c may be an integer of 0 to 4.
As an example of compounds represented by Chemical Formula 1, Chemical Formulas 1-1, 1-2, 1-3, 1-4, 1-5, and 1-6 may be provided.
Chemical Formula 1-1
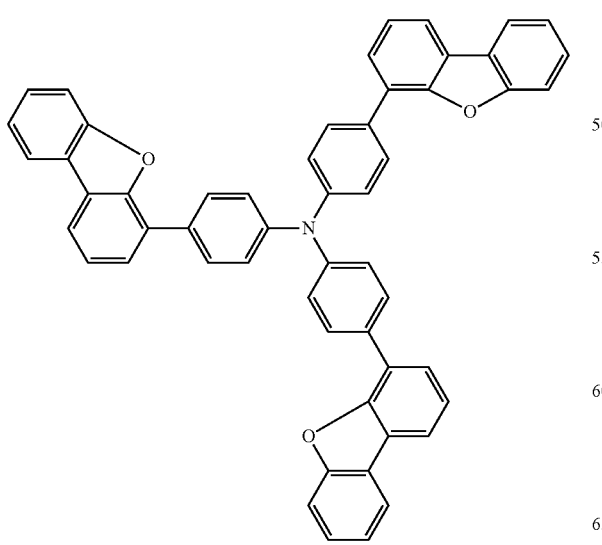
Chemical Formula 1-2
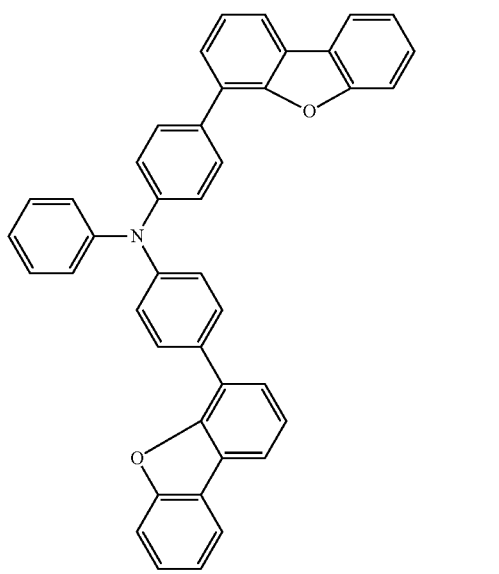
Chemical Formula 1-3
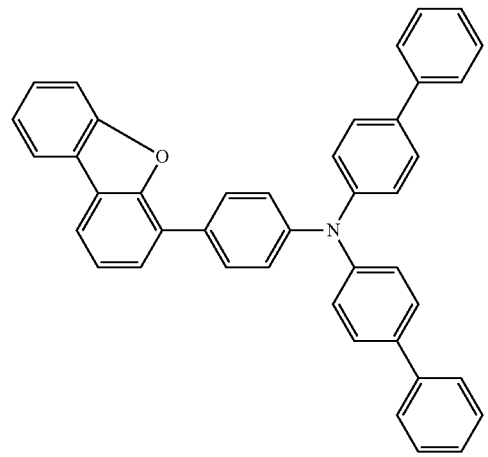
Chemical Formula 1-4
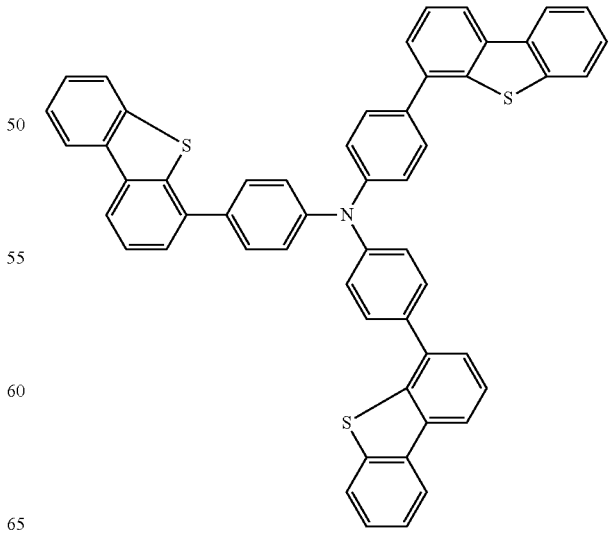

Chemical Formula 1-5

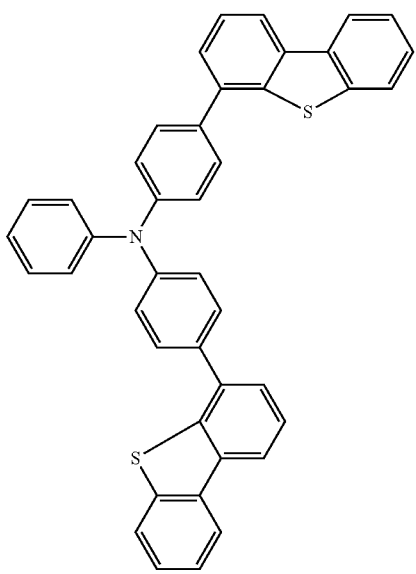

Chemical Formula 1-6

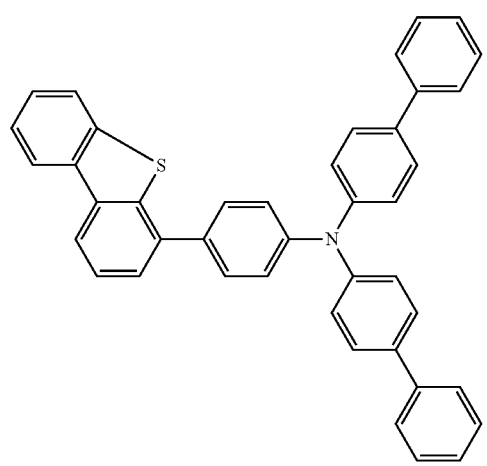

In one or more exemplary embodiments, the hole blocking layer 20A may include a compound represented by Chemical Formula 2.

Chemical Formula 2

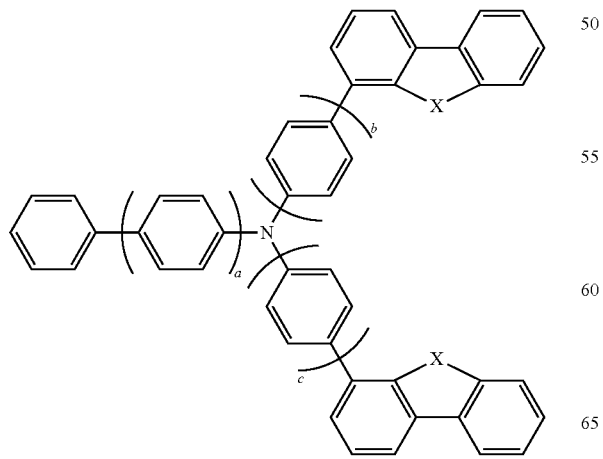

In Chemical Formula 2, a, b, and c may be 0 to 3, X may be selected from O, N or S, and each X may be equal to the other or may be different from the other.

As an example of the compound represented by Chemical Formula 2, Chemical Formulas 2-1 to 2-5 may be provided.

Chemical Formula 2-1

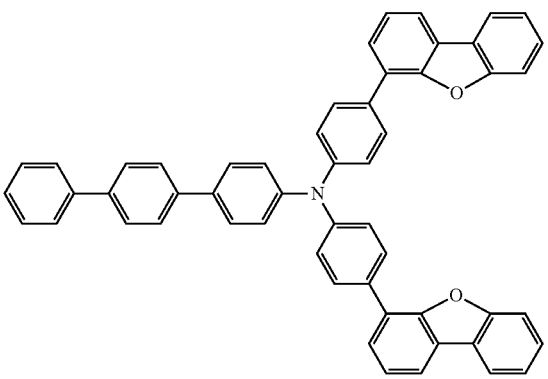

Chemical Formula 2-2

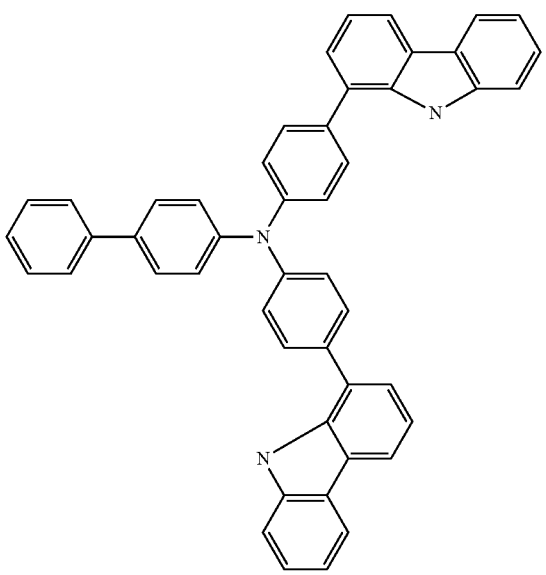

Chemical Formula 2-3

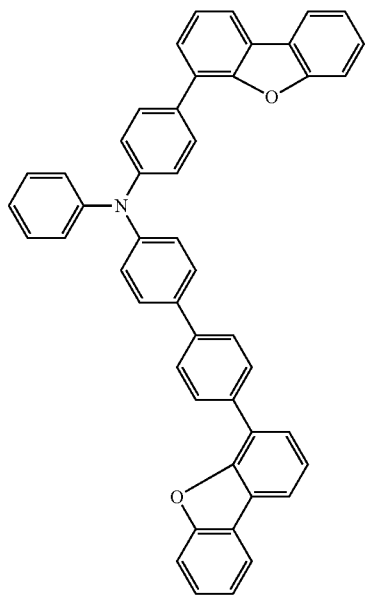

Chemical Formula 2-5

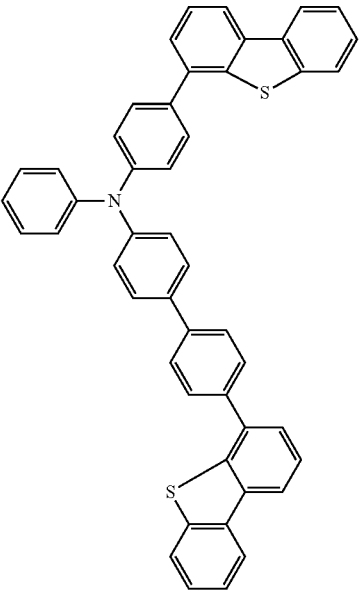

In one or more exemplary embodiments, the hole blocking layer 20A may include a compound represented by Chemical Formula 3.

Chemical Formula 3

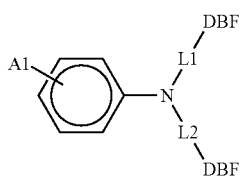

In Chemical Formula 3, A1 may be an alkyl group, aryl group, carbazole, dibenzothiophene, or dibenzofuran (DBF), and L1 and L2 may be Chemical Formula 2-4

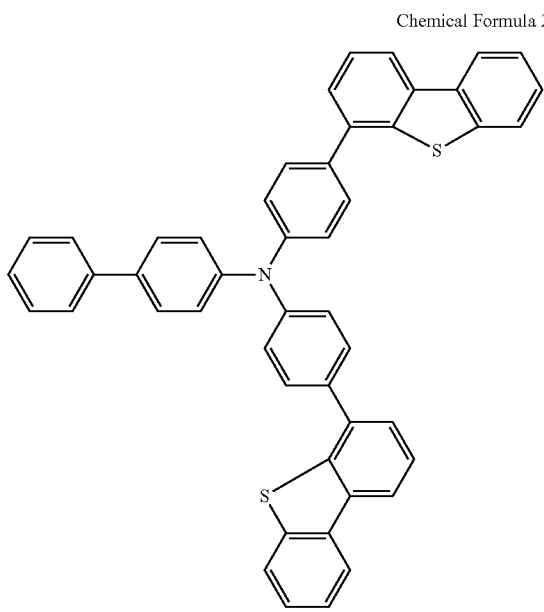

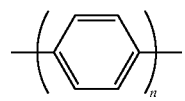

(n is 0 to 3), and DBF connected to L1 and L2 may be replaced with carbazole or dibenzothiophene.

The hole transport layer 20B is positioned between the plurality of hole blocking layers 20A and transmits the holes that is moved from the first electrode 10 into the hole blocking layer 20A to the emission layer 30.

The thickness of the hole transport layer 20B may be in the range of about 30 angstroms to 120 angstroms. Hole transport layer 20B thinner than 30 angstroms may not function properly in transmitting the hole. Hole transport layer 20B thicker than 120 angstroms, may not properly control the hole transmission due to it excessive thickness occupied by the hole transport layer 20B in the hole auxiliary layer 20, and may deteriorate the current efficiency. According to an exemplary embodiment of the present invention, the hole transport layer 20B may have be between about 30 angstroms to about 120 angstroms thick.

In one or more exemplary embodiments, the hole transport layer 20B may have a carbazole derivative such as N-phenylcarbazole, polyvinylcarbazole, or the like, or a typical amine derivative having an aromatic fused ring such as N,N'-bis (3-methylphenyl)-N,N'-diphenyl-[1,1-biphenyl]-4,4'-diamine (TPD), N,N'-di(naphthalen-1-yl)-N,N'-diphenylbenzidine (α-NPD), or the like. However, the hole transport layer 20B is not limited thereto. A material functioning as the above-described materials and that is widely used in the art related to the exemplary embodiment of the present invention may be used.

The emission layer 30 is positioned between the first electrode 10 and the second electrode 50. The emission layer 30 includes an emission material associated with a specific color. In one or more exemplary embodiments, the emission layer 30 may display a basic color such as blue, green, or red, or a combination thereof. For instance, the emission layer 30 according to an exemplary embodiment of the present invention may emit blue. Since the hole auxiliary layer 20 of the organic light emitting element emitting blue is thinner than the hole auxiliary layer 20 of the organic light emitting element emitting red and green, it is more to control of the holes moving into the blue emission layer 30. The organic light emitting element emitting blue with the hole blocking layer 20A may effectively control holes moving into the emission layer 30.

In one or more exemplary embodiments, the emission layer 30 includes a host and a dopant to emit any one color.

In one or more exemplary embodiments, the emission layer 30 includes a host material including CBP (carbazole biphenyl) or mCP (1,3-bis(carbazol-9-yl), and a phosphorescent material including at least one selected from a group consisting of PIQIr(acac) (bis(1-phenylisoquinoline)acetylacetonate iridium), PQIr(acac) (bis(1-phenylquinoline) acetylacetonate iridium), PQIr (tris(1-phenylquinoline) iridium), and PtOEP (platinum octaethylporphyrin) when the emission layer 30 emits red light. Alternatively, the emission layer 30 may be formed of a fluorescent material including PBD:Eu(DBM)3(Phen) or perylene, but the above-described materials are only examples, and are not limited thereto.

In one or more exemplary embodiments, the emission layer 30 includes a host material including CBP or mCP, and a phosphorescent material including a dopant material including Ir(ppy)3 (fac-tris(2-phenylpyridine)iridium) when the emission layer 30 emits green light. Alternatively, the emission layer 30 may be formed of a fluorescent material including Alq3(tris(8-hydroxyquinolino)aluminum), but the above-described materials are only examples and are not limited thereto.

In one or more exemplary embodiments, the emission layer 30 includes a host material including CBP or mCP, and a phosphorescent material including a dopant that includes (4,6-F2ppy)2Irpic when the emission layer 30 emits blue light. Alternatively, the emission layer 30 may be made of a fluorescent material including at least one selected from a group consisting of spiro-DPVBi, spiro-6P, distyrylbenzene (DSB), distyrylarylene (DSA), a PFO-based polymer, and a PPV-based polymer, but the above-described materials are examples and are not limited thereto.

The electron transport layer 40 is positioned between the emission layer 30 and the second electrode 50. The electron transport layer 40 helps the electron injected from the second electrode 50 to be easily moved into the emission layer 30.

The electron transport layer 40 may include an organic material. For example, the electron transport layer 40 may include at least one selected from a group including Alq3 (tris (8-hydroxyquinolino)aluminum), PBD (2-[4-biphenyl-5-[4-tert-butylphenyl]]-1,3,4-oxadiazole), TAZ (1,2,4-triazole), spiro-PBD(spiro-2-[4-biphenyl-5-[4-tert-butylphenyl]]-1,3,4-oxadiazole), and BAlq (8-hydroxyquinoline beryllium salt).

The second electrode 50 may be the cathode. In this manner, the second electrode 50 may include a material having a low work function so as to easily inject the electron to the emission layer 30.

For example, the second electrode 50 may include, but not limited thereto, a metal such as magnesium, calcium, sodium, potassium, titanium, indium, yttrium, lithium, gadolinium, aluminum, silver, tin, lead, cesium, barium, and the like, or an alloy thereof, or a multi-layered structure material such as LiF/Al, LiO$_2$/Al, LiF/Ca, LiF/Al, and BaF$_2$/Ca.

In one or more exemplary embodiments, the second electrode 50 may include a conductive oxide such as indium tin oxide (ITO), indium zinc oxide (IZO), tin oxide (Sn O$_2$), zinc oxide (ZnO), or combinations thereof, or may include a metal such as aluminum, silver, magnesium of thin thickness. For instance, the second electrode 50 may be made of a multi-layered structure having combinations of the conductive oxide and the metal, or one of the conductive oxide and the metal.

In one or more exemplary embodiments, the entire organic light emitting element for red light may be about 1100 angstroms or less thick when the organic light emitting element emits red light, the entire organic light emitting element for green light may be about 900 angstroms or less thick, and the entire organic light emitting element for blue light may be about 700 angstroms or less thick.

Figure 2:
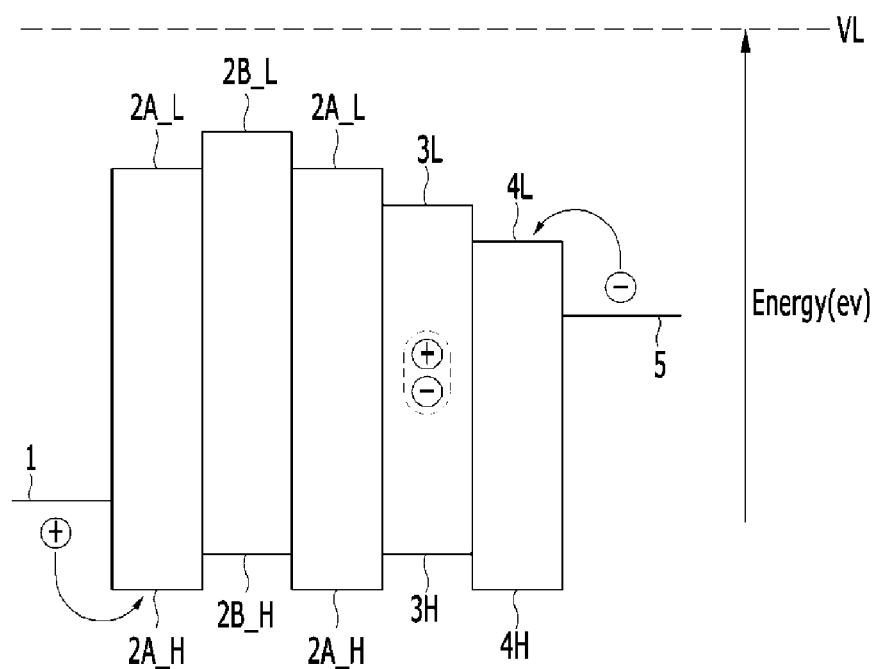
FIG. 2 is a view illustrating an energy level of the organic light emitting element described in FIG. 1 according to an exemplary embodiment.

FIG. 2 is a view illustrating an energy level of the organic light emitting element described in FIG. 1 according to an exemplary embodiment.

In FIG. 2, a horizontal direction from left to right sequentially represents an energy level 1 of the first electrode 10, a highest occupied molecular orbital (hereinafter, HOMO) energy level 2A_H and a lowest unoccupied molecular orbital (hereinafter, LUMO) energy level 2A_L of the hole blocking layer 20A, a HOMO energy level 2B_H and a LUMO energy level 2B_L of the hole transport layer 20B, a HOMO energy level 2A_H and a LUMO energy level 2A_L of the hole blocking layer 20A, a HOMO energy level 3H and a LUMO energy level 3L of the emission layer 30, a HOMO energy level 4H and a LUMO energy level 4L of the electron transport layer 40, and an energy level 5 of the second electrode 50.

Also, a vertical axis represents an energy level eV with reference to a vacuum level VL. Since the energy level has a negative value, the energy level has a higher value as it is closer to the vacuum level VL. Meanwhile, the work function means energy required to move the charge at each energy level to the vacuum level VL, therefore an absolute value of the energy level is the same as the work function.

Referring to FIG. 1 and FIG. 2, the movement of the hole injected from the first electrode 10 will be described.

Referring to FIG. 1 and FIG. 2, the hole is injected from the first electrode 10 having a predetermined energy level 1 and reaches the HOMO energy level 3H of the emission layer 30 after passing through the HOMO energy level 2A_H of the hole blocking layer 20A adjacent to the first electrode 10, the HOMO energy level 2B_H of the hole transport layer 20B, and the HOMO energy level 2A_H of the hole blocking layer 20A adjacent to the emission layer 30. The hole may move along the HOMO energy level of each layer in order of the first electrode 10, the hole blocking layer 20A, the hole transport layer 20B, the hole blocking layer 20A, and the emission layer 30.

The hole moved to the hole transport layer 20B through the first electrode 10 and the hole blocking layer 20A adjacent to the first electrode 10 may move to the emission layer 30 through the hole blocking layer 20A, adjacent to the emission layer 30, which has a lower HOMO energy level than the hole transport layer 20B. Sine the hole blocking layer 20A adjacent to the emission layer 30 has the lower HOMO energy level 2A_H than the HOMO energy level 2B_H of the hole transport layer 20B as shown in FIG. 2, a difference between the HOMO energy level 2A_H of the hole blocking layer 20A adjacent to the emission layer 30 and the HOMO energy level 2B_H of the hole transport layer 20B acts as a barrier.

That is, compared to the case that has no hole blocking layer 20A, the hole moves to the emission layer 30 through the hole blocking layer 20A, thereby passing the barrier depending on the energy level difference. This may control the hole mobility to the emission layer.

In an exemplary embodiments, the difference between the HOMO energy level of the hole blocking layer 20A and the HOMO energy level of the hole transport layer 20B may be about 0.2 eV or more to 1.0 eV or less. It may allow to control the hole mobility appropriately. Energy level difference less than 0.2 eV makes it difficult to form the energy barrier. Energy level difference over 1.0 eV, the hole mobility may be too low to move proper number of holes to the emission layer 30.

The HOMO energy level 2A_H of the hole blocking layer 20A may be lower than the HOMO energy level 3H of the emission layer 30. Accordingly, the hole moved to the hole blocking layer 20A adjacent to the emission layer 30 is moved to the emission layer 30 having the HOMO energy level 3H.

The movement of the electron injected from the second electrode 50 will be described below.

The electron is injected from the second electrode 50 having the predetermined energy level 5 and reaches the LUMO energy level 3L of the emission layer 30 through the LUMO energy level 4L of the electron transport layer 40.

The electron that reaches the emission layer 30 along this path may be combined with the hole that reaches the emission layer 30 to form the exciton, emitting a light while releasing energy.

In one or more embodiments, the LUMO energy level 2A_L of the hole blocking layer 20A may be higher than the LUMO energy level 3L of the emission layer 30, thereby controlling the movement of the electron toward the first electrode 10 through the emission layer 30.

In one or more embodiments, the organic light emitting element may further include function layers (not shown), such as, a hole injection layer between the first electrode 10 and the hole auxiliary layer 20, and an electron injection layer between the electron transport layer 40 and the second electrode 50.

According to an exemplary embodiment of the present invention, the organic light emitting element may have high stability and emission efficiency by controlling the hole injected to the emission layer 30, even if the organic light emitting element and/or the hole auxiliary layer 20 is thin. In addition, this may also extend the lifespan of the element.

Figure 3:
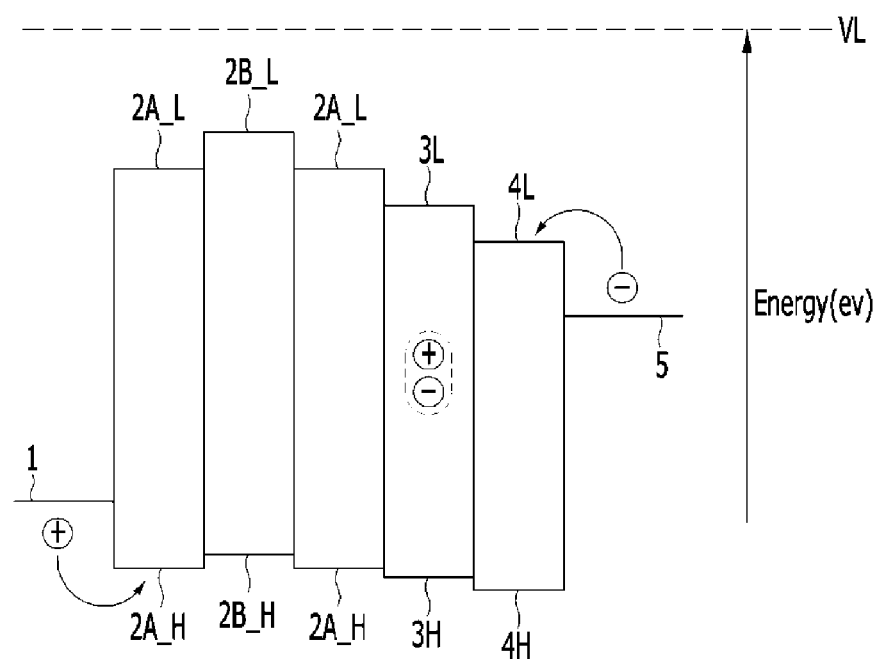
FIG. 3 is a view showing an energy level of the organic light emitting element described with reference to FIG. 1 according to another exemplary embodiment.

FIG. 3 is a view showing an energy level of the organic light emitting element described with reference to FIG. 1 according to another exemplary embodiment. The description for the same or similar constituent elements as the constituent elements described in FIG. 1 and FIG. 2 may be omitted.

The electron having the energy level 5 may move from the second electrode 50 to the emission layer 30 in a similar manner described with reference to FIG. 2. Hereinafter, overlapping descriptions will be omitted.

Referring to FIG. 1 and FIG. 3, first the hole is injected from the first electrode 10 having the predetermined energy level 1 and reaches the HOMO energy level 3H of the emission layer 30 after passing through the HOMO energy level 2A_H of the hole blocking layer 20A adjacent to the first electrode 10, the HOMO energy level 2B_H of the hole transport layer 20B, and the HOMO energy level 2A_H of the hole blocking layer 20A adjacent to the emission layer 30. That is, the hole may move along the HOMO energy level of each layer in order of the first electrode 10, the hole blocking layer 20A, the hole transport layer 20B, the hole blocking layer 20A, and the emission layer 30.

As shown in FIG. 3, the hole that moves to the hole transport layer 20B through the hole blocking layer 20A adjacent to the first electrode 10 is moved to the hole blocking layer 20A. The hole in the hole blocking layer 20A adjacent to the emission layer 30 may move to the emission layer 30. The HOMO energy level 2A_H of the hole blocking layer 20A may be lower than the HOMO energy level 2B_H of the hole transport layer 20B. The HOMO energy level 3H of the emission layer 30 may be lower than the HOMO energy level 2A_H of the hole blocking layer 20A.

According to the exemplary embodiment shown in FIG. 3, the hole is moved through the HOMO energy levels that are sequentially decreased along the hole transport layer 20B, hole blocking layer 20A, and the emission layer 30. The mobility of the hole moving along the emission layer 30 may be effectively controlled by moving the hole along the step-shaped HOMO energy level.

The hole may move directly from the hole transport layer 20B to the emission layer 30 if the hole blocking layer 20A adjacent to the emission layer 30 is not provided. It means that the hole moves the HOMO energy level of one step shape such that it is difficult to control the hole mobility compared to the hole mobility according to the exemplary embodiment shown in FIG. 3.

In one or more exemplary embodiments, the difference between the HOMO energy level 2A_H of the hole blocking layer 20A and the HOMO energy level 2B_H of the hole transport layer 20B may be in the range of more than about 0.2 eV to less than about 1 eV. It may allow to control the mobility of the hole appropriately. When the energy level difference is less than 0.2 eV, it is difficult to form the energy barrier. When the energy level difference is more than 1 eV, the hole mobility may be very low and the amount of the hole transmitted to the emission layer 30 may be remarkably decreased.

Figure 4:
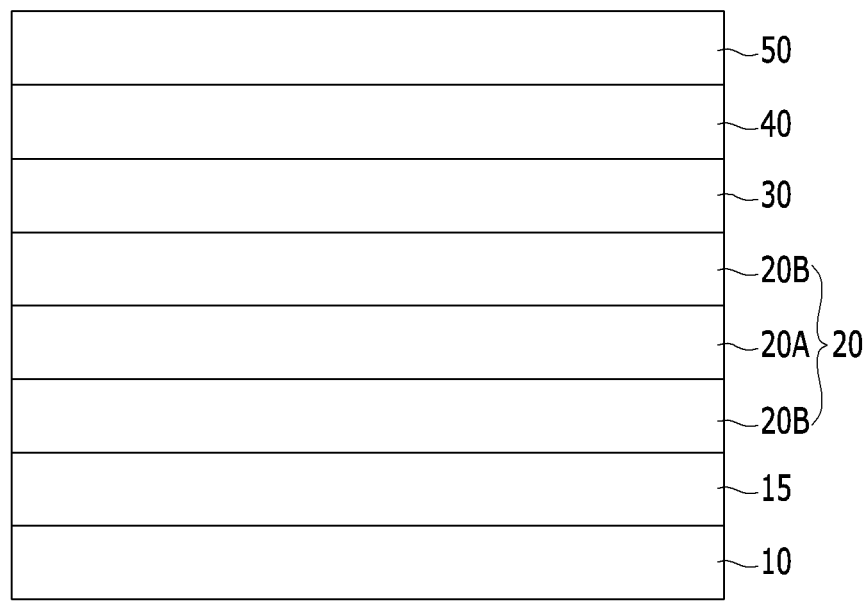
FIG. 4 is a cross-sectional view of the organic light emitting element according to another exemplary embodiment.

FIG. 4 is a cross-sectional view of the organic light emitting element according to another exemplary embodiment.

Referring to FIG. 4, an organic light emitting element includes the first electrode 10, the second electrode 50 facing the first electrode 10, the emission layer 30 between the first electrode 10 and the second electrode 50, the hole injection layer 15 and the hole auxiliary layer 20 between the first electrode 10 and the emission layer 30, and the electron transport layer 40 between the emission layer 30 and the second electrode 50. The first electrode 10, the emission layer 30, the electron transport layer 40, and the second electrode 50 are the same as shown in FIG. 1 such that a duplicate description thereof is omitted.

Referring to FIG. 4, the hole injection layer 15 is positioned between the first electrode 10 and the hole auxiliary layer 20. The hole injection layer 15 transmits the hole injected from the first electrode 10 to the hole auxiliary layer 20, thereby functioning to improve the injection of the hole.

The hole injection layer 15 may include a bipolar material in which a metal or non-metal having a predetermined work function to improve the hole injection and halogen are combined. However, the hole injection layer 15 is not limited thereto and other inorganic materials or organic materials may be included.

As one example, the metal or the non-metal may be one element selected from the group consisting of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, and Zn.

The hole auxiliary layer 20 is positioned between the hole injection layer 15 and the emission layer 30. The hole auxiliary layer 20 may help the hole to be transmitted from the first electrode 10 to the emission layer 30.

According to an exemplary embodiment, the hole auxiliary layer 20 is in the range from about 140 angstroms (Å) to 220 angstroms (Å) thick.

The hole auxiliary layer 20 includes two hole transport layers 20B and one hole blocking layer 20A between two hole transport layers 20B. However, it is not limited thereto. For instance, the hole auxiliary layer 20 may include an even number of hole transport layers 20B and odd number of hole blocking layers 20A that are alternately positioned.

The hole blocking layer 20A may control the transmission of the holes injected from the first electrode 10. Even though the hole auxiliary layer 20 is thin, the hole blocking layer 20A prevents the holes from being excessively injected from the first electrode 10 to the emission layer 30, thereby adjusting the charge balance in the emission layer 30.

The hole transport layer 20B transmits the hole injected from the first electrode 10 to the hole blocking layer 20A or the emission layer 30.

According to the exemplary embodiment of shown in FIG. 4, the hole injected from the first electrode 10 may be moved in order to the hole transport layer 20B adjacent to the first electrode 10, the hole blocking layer 20A, the hole transport layer 20B adjacent to the emission layer 30, and the emission layer 30. The hole reaching the hole transport layer 20B adjacent to the first electrode 10 may move beyond the barrier of the HOMO energy level difference of the hole blocking layer 20A and hole transport layer 20B to reach the HOMO energy level of the hole blocking layer 20A.

Accordingly, the hole auxiliary layer 20 including the hole blocking layer 20A may effectively control the hole mobility compared to the organic light emitting element without the hole blocking layer, thereby providing improved efficiency and lifespan of the organic light emitting element.

Figure 5:
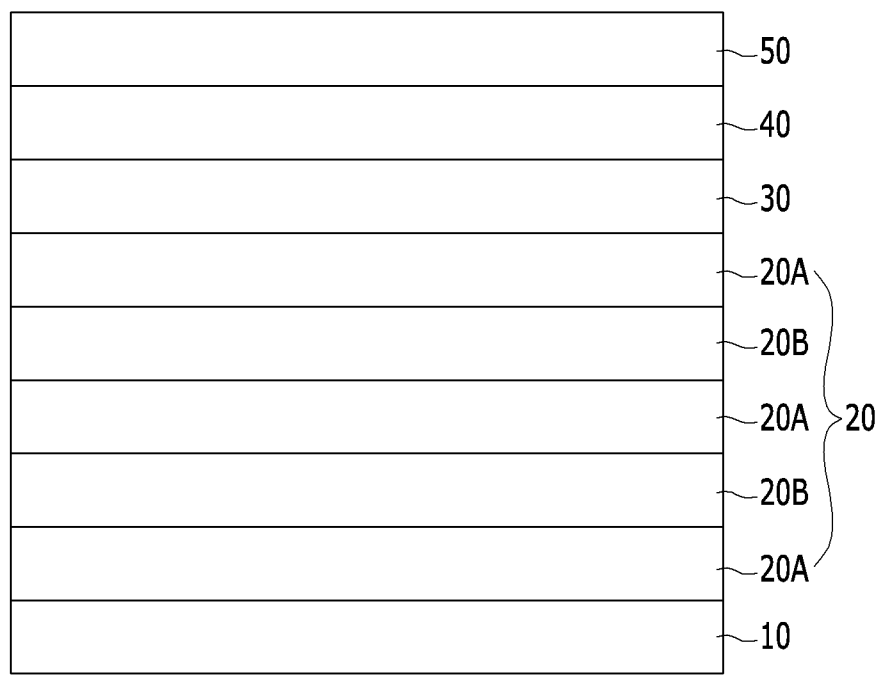
FIG. 5 is a cross-sectional view of the organic light emitting element according to still another exemplary embodiment.

FIG. 5 is a cross-sectional view of the organic light emitting element according to still another exemplary embodiment.

Referring to FIG. 5, the organic light emitting element includes the first electrode 10, the second electrode 50 facing the first electrode 10, the emission layer 30 between the first electrode 10 and the second electrode 50, the hole auxiliary layer 20 between the first electrode 10 and the emission layer 30, and the electron transport layer 40 between the emission layer 30 and the second electrode 50. The first electrode 10, the emission layer 30, the electron transport layer 40, and the second electrode 50 are the same as shown in FIG. 1 such that a duplicate description thereof is omitted.

The hole auxiliary layer 20 includes three hole blocking layers 20A and two hole transport layers 20B. Three hole blocking layers 20A and two hole transport layers 20B are alternately positioned. It is understood that the number of the hole blocking layers 20A and the number of the hole transport layers 20B may be modified variously. For example, an even number of hole blocking layers and odd number of hole transport layers between the adjacent hole blocking layers may be included in, or an even number of hole transport layers and odd number of hole blocking layers between the adjacent hole transport layers may be included in, and the even number and odd number may be any natural number greater than 1.

Figure 6:
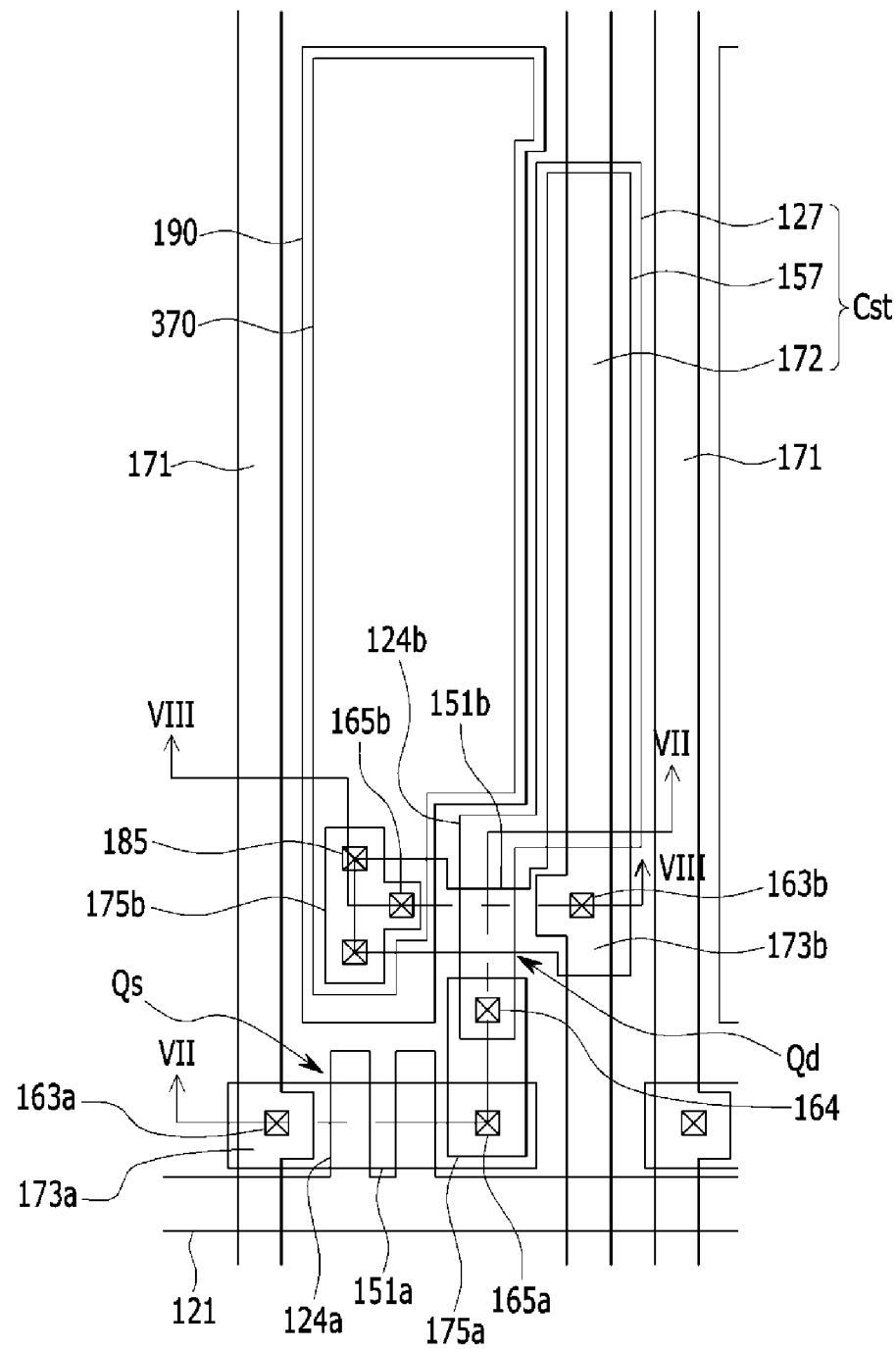
FIG. 6 is a top plan view of one pixel of an organic light emitting diode display including an organic light emitting element according to an exemplary embodiment.
Figure 7:
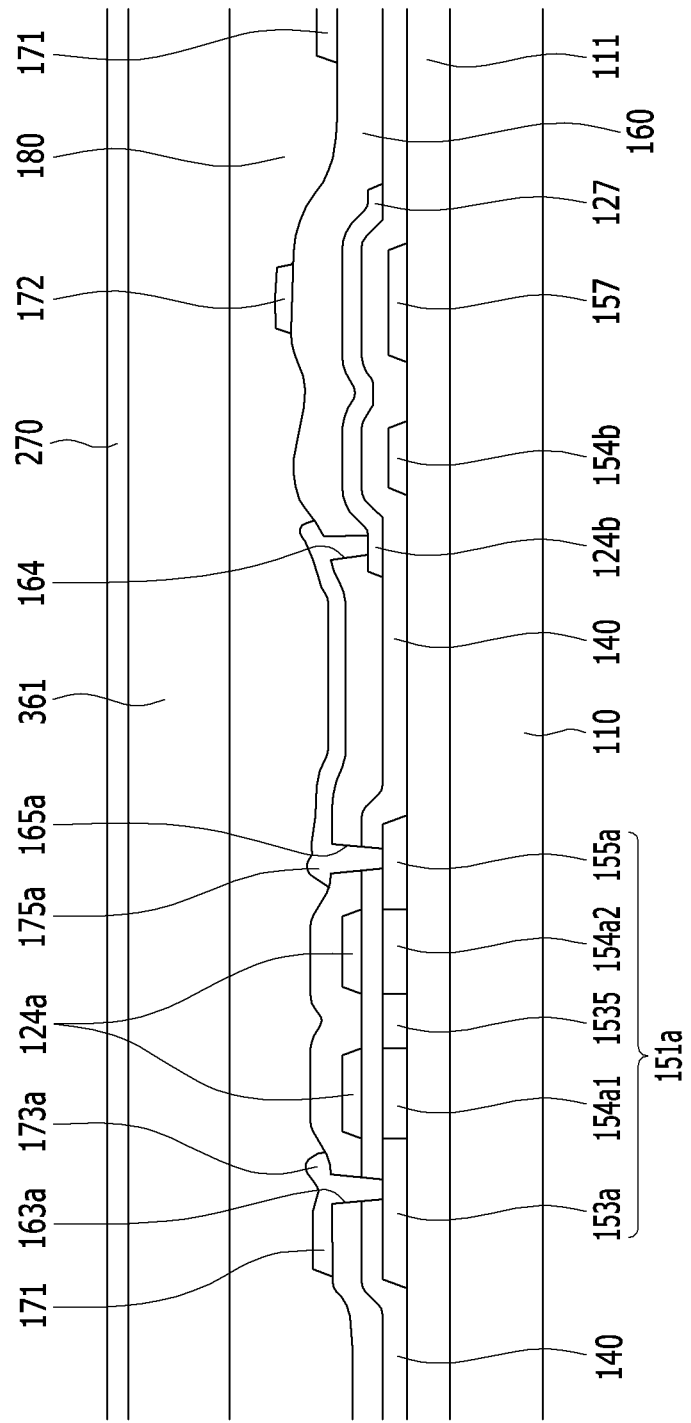
FIG. 7 is a cross-sectional view taken along line VII-VII of FIG. 6.
Figure 8:
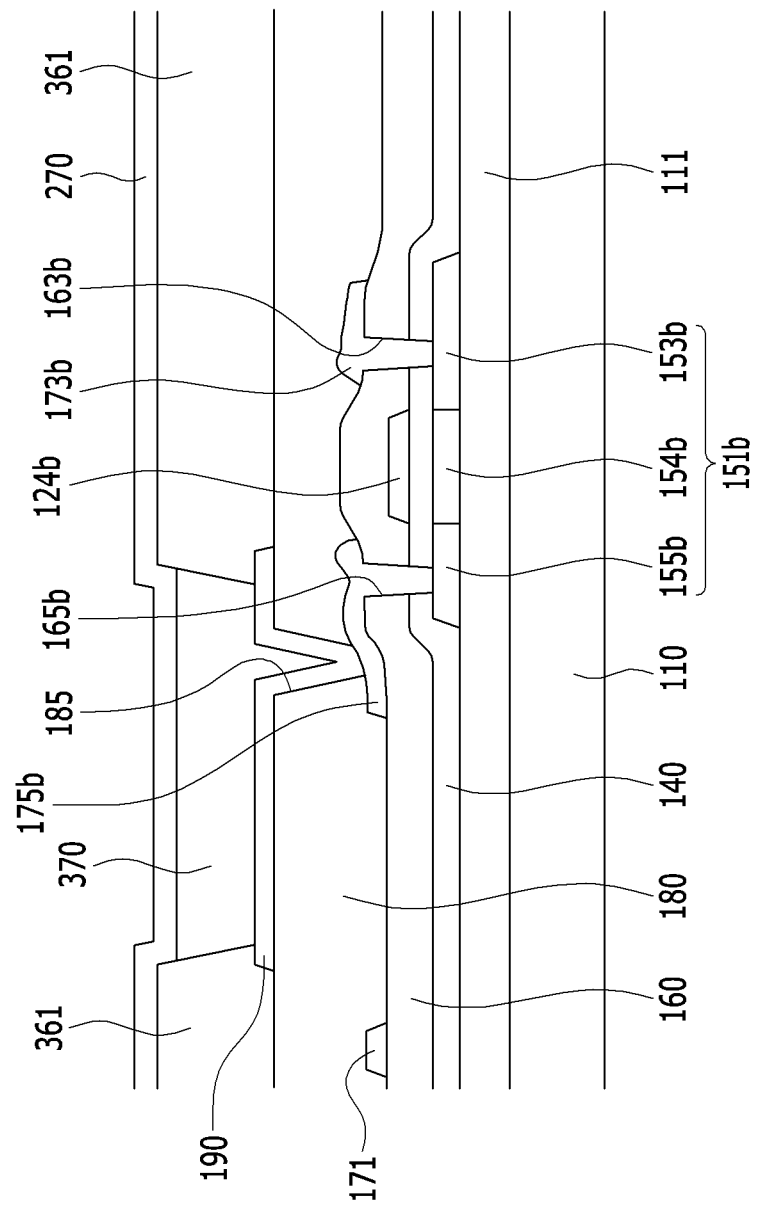
FIG. 8 is a cross-sectional view taken along line VIII-VIII of FIG. 6.

FIG. 6 is a top plan view of one pixel of an organic light emitting diode display including an organic light emitting element according to an exemplary embodiment, FIG. 7 is a cross-sectional view taken along line VII-VII of FIG. 6, and FIG. 8 is a cross-sectional view taken along line VIII-VIII of FIG. 6.

Referring to FIG. 6 to FIG. 8, a blocking layer 111 formed of a silicon oxide or silicon nitride is disposed on a substrate 110 made of transparent glass.

A plurality of pairs of first and second semiconductor patterns 151a and 151b that are preferably formed of polysilicon are disposed on the blocking layer 111. The first and second semiconductors patterns 151a and 151b include extrinsic regions including conductive impurities of an n-type or a p-type, and at least one intrinsic region that does not include conductive impurities.

In the first semiconductor pattern 151a, the extrinsic region includes first source and drain regions 153a and 155a and an intermediate region 1535 which are separated from each other. In one or more exemplary embodiments, the extrinsic regions 153a, 1535, and 155a of the first semiconductor pattern 151a may be doped with an n-type impurity. The intrinsic region includes a pair of first channel regions 154a1 and 154a2 disposed between the extrinsic regions 153a, 1535, and 155a.

In the second semiconductor pattern 151b, the extrinsic region includes a second source region 153b and a second drain region 155b. The second source region 153b and the second drain region 155b are doped with the p-type impurity and separated from each other. The intrinsic region includes a second channel region 154b disposed between the second source and drain regions 153b and 155b and a storage region 157 extending from the second drain region 153b upward.

In one or more exemplary embodiments, the extrinsic region further includes lightly doped regions (not shown) disposed between the channel regions 154a1, 154a2, and 154b, and the source and drain regions 153a, 155a, 153b, and 155b. The lightly doped regions may be replaced by offset regions that do not include impurities.

Alternatively, the extrinsic regions 153a and 155a of the first semiconductor pattern 151a may be doped with p-type impurities, and the extrinsic regions 153b and 155b of the second semiconductor pattern 151b may be doped with n-type impurities. The conductive p-type impurity may be boron (B) or gallium (Ga), and the conductive impurity of the n-type may be phosphorus (P) or arsenic (As).

A gate insulating layer 140 preferably formed of a silicon nitride or silicon oxide is disposed on the first and second semiconductor patterns 151a and 151b and the blocking layer 111.

A gate line 121 including a first control electrode 124a and a gate conductor including a second control electrode 124b is disposed on the gate insulating layer 140.

The gate lines 121 function to transfer a gate signal and generally extend in a transverse direction. The first control electrode 124a extends from the gate line 121 to cross the first semiconductor pattern 151a, thereby overlapping the first channel regions 154a1 and 154a2.

Each gate line 121 may include an end portion having a large area for contacting another layer or an external driving circuit. When a gate driving circuit (not shown) for generating gate signals is disposed on the substrate 110, the gate lines 121 may extend and be directly connected to the gate driving circuit.

The second control electrode 124b is separated from the gate line 121 and overlaps the second channel region 154b of the second semiconductor pattern 151b. The second control electrode 124b extends to form the storage electrode 127, and the storage electrode 127 overlaps the storage region 157 of the second semiconductor pattern 151b.

The interlayer insulating layer 160 is disposed on the gate conductor and gate insulating layer 140.

In one or more exemplary embodiments, the first interlayer insulating layer 160 is formed of an inorganic insulator such as a silicon nitride, a silicon oxide, and so on, an organic insulator, or an insulator having a low dielectric constant. It is preferable that the dielectric constant of the organic insulator and the low dielectric insulator is less than 4.0, for example a-Si:C:O or a-Si:O:F, which is formed through plasma enhanced chemical vapor deposition (PECVD). In one or more exemplary embodiments, the first interlayer insulating layer 160 may be formed of an organic insulator having photosensitivity, and may provide a flat surface.

A contact hole 164 exposing the second control electrode 124b is provided in the interlayer insulating layer 160. Further contact holes 163a, 163b, 165a, and 165b exposing the source regions and the drain regions 153a, 153b, 155a, and 155b are provided in the interlayer insulating layer 160 and the gate insulating layer 140.

A data conductor including a data line 171, a driving voltage line 172, and first and second output electrodes 175a and 175b is disposed on the interlayer insulating layer 160.

The data line 171 transmits a data signal and mainly extends in a longitudinal direction, thereby crossing the gate line 121. Each data line 171 includes a first input electrode 173a connected to the first source region 153a through the contact hole 163a.

Each data line 171 may include an end portion having a large area for contacting another layer or an external driving circuit. When a data driving circuit (not shown) for generating data signals is disposed on the substrate 110, the data line 171 may extend and be directly connected to the data driving circuit.

The driving voltage line 172 transmits a driving voltage and mainly extends in the longitudinal direction, thereby crossing the gate line 121. The driving voltage line 172 includes a second input electrode 173b connected to the second source region 153b through the contact hole 163b. The driving voltage line 172 overlaps the storage electrode 127 and they may be connected to each other.

The first output electrode 175a is separated from the data line 171 and the driving voltage line 172. The first output electrode 175a is connected to the first drain region 155a through the contact hole 165a and is connected to the second control electrode 124b through the contact hole 164.

The second output electrode 175b is separated from the data line 171, the driving voltage line 172, and the first output electrode 175a, and is connected to the second drain region 155b through the contact hole 165b.

In one or more exemplary embodiments, side surfaces of the data conductors 171, 172, 175a, and 175b are also inclined to the surface of the substrate 110, and an inclination angle thereof is about 30° to 80° like the gate conductors 121 and 124b.

The passivation layer 180 is disposed on the data conductors 171, 172, 175a, and 175b and the interlayer insulating layer 160. The passivation layer 180 is formed of an inorganic material, an organic material, or a low dielectric constant insulating material.

A contact hole 185 exposing the second output electrode 175b is provided in the passivation layer 180. Further, a contact hole (not shown) exposing the end of the data line 171 may be provided in the passivation layer 180, and a contact hole (not shown) exposing the end of the gate line 121 may be provided in the passivation layer 180 and the interlayer insulating layer 160.

The pixel electrode 190 is disposed on the passivation layer 180. The pixel electrode 190 is physically and electrically connected to the second output electrode 175b through the contact hole 185. In one or more exemplary embodiments, the pixel electrode 190 may be formed of a transparent conductive material such as ITO or IZO or a reflective metal such as aluminum, silver, or alloys thereof.

A partition 361 is disposed on the passivation layer 180. The partitions 361 define a plurality of openings enclosing edges of the pixel electrodes 191 like a bank, and are formed of an organic insulator or an inorganic insulator. In one or more exemplary embodiments, the partitions 361 may be formed of a photoresist including black pigments. In this manner, the partitions 361 function as a light blocking member, thereby simplifying the manufacturing process.

A light-emitting element layer 370 is disposed on the pixel electrode 190, and a common electrode 270 is disposed on the light-emitting element layer 370. The organic light emitting element includes the pixel electrode 190, the light-emitting element layer 370, and the common electrode 270.

The pixel electrode 190 and the common electrode 270 may be provided as the first electrode 10 and the second electrode 50 shown in FIG. 1. In one or more exemplary embodiments, the pixel electrode 190 may correspond to the anode of the hole injection electrode, i.e., the above-described first electrode 10, and the common electrode 270 may correspond to the cathode of the electron injection electrode, i.e., the above-described second electrode 50. However, the exemplary embodiment is not limited thereto. In one or more exemplary embodiments, the pixel electrode 190 may be a cathode and the common electrode 270 may be an anode.

The light-emitting element layer 370 may include the hole auxiliary layer 20, the emission layer 30, and the electron transport layer 40 described with reference to FIG. 1 to FIG. 5

The hole and electron are injected into the organic emission layer 370 from the pixel electrode 190 and the common electrode 270, respectively, and an exciton generated by coupling the injected hole and electron falls from an excited state to a ground state to emit light.

The first semiconductor pattern 151a, the first control electrode 124a connected to the gate line 121, the first input electrode 173a connected to the data line 171, and the first output electrode 175a form a switching transistor (switching TFT) Qs, and the channel of the switching transistor Qs is formed in the channel regions 154a1 and 154a2 of the first semiconductor pattern 151a. The second semiconductor pattern 151b, the second control electrode 124b connected to the first output electrode 175a, the second input electrode 173b connected to the driving voltage line 172, and the second output electrode 175b connected to the pixel electrode 190 form a driving transistor (driving TFT) Qd, and the channel of the driving transistor Qd is formed in the channel region 154b of the second semiconductor pattern 151b. The pixel electrode 190, the light-emitting element layer 370, and the common electrode 270 form the organic light emitting diode, and the pixel electrode 190 is an anode and the common electrode 270 is a cathode, or conversely, the pixel electrode 191 is a cathode and the common electrode 270 is an anode. The storage electrode 127, and the driving voltage line 172, and the storage region 157 overlapping each other form a storage capacitor Cst.

The switching transistor Qs transmits the data signal of the data line 171 in response to the gate signal of the gate line 121. The driving transistor Qd may provide the current having a magnitude corresponding to the voltage difference between the second control electrode 124b and the second input electrode 173b when receiving the data signal. The voltage difference between the second control electrode 124b and the second input electrode 173b is charged to the storage capacitor Cst and is maintained after the switching transistor Qs is turned off. The organic light emitting diode emits light by differentiating an intensity depending on the magnitude of the current flowing to the driving transistor Qd, thereby displaying images.

However, the structure of the described organic light emitting diode display is one example, and the organic light emitting element according to an exemplary embodiment of the present invention may be clearly applied to an organic light emitting diode display having a different structure.

Figure 9:
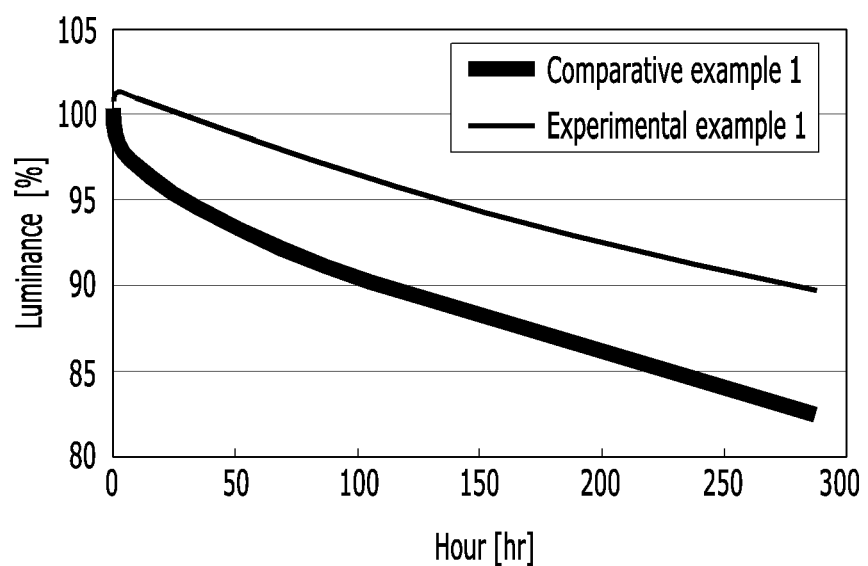
FIG. 9 is a graph showing luminance and lifespan according to an experimental example 1 and a comparative example 1 for an organic light emitting element.

FIG. 9 is a graph showing the luminance and lifespan according to an experimental example 1 and a comparative example 1 for an organic light emitting element.

Referring to FIG. 9, the experimental example 1 relates to the organic light emitting element including the hole auxiliary layer having about 140 angstroms thick according to an exemplary embodiment, and specifically, the hole blocking layer has about 30 angstroms thick, the hole transport layer has about 80 angstroms thick, and the hole auxiliary layer has the deposition structure of the hole blocking layer, the hole transport layer, and the hole blocking layer. Comparative example 1 relates to the organic light emitting element including the hole auxiliary layer having about 140 angstroms thick while the hole auxiliary layer does not separately include the hole blocking layer. In experimental example 1 and comparative example 1, configurations other than the hole auxiliary layer are the same.

Referring to the luminance deterioration depending on the time passage for experimental example 1 and comparative example 1, as shown in FIG. 9, after about 300 hours have elapsed, it may be confirmed that about 90% luminance appears in experimental example 1 and about 83% luminance appears in comparative example 1.

Also, experimental example 1 may have a lifespan of about 140 hours when based on about 95% luminance, whereas comparative example 1 has a lifespan of about 40 hours when based on about 90% luminance. Accordingly, experimental example 1 may have a lifespan of more than about 2.5 times that of comparative example 1.

It may be confirmed that the organic light emitting element including the hole blocking layer according to an exemplary embodiment of the present invention has improved lifespan and luminance compared to the comparative example.

Figure 10:
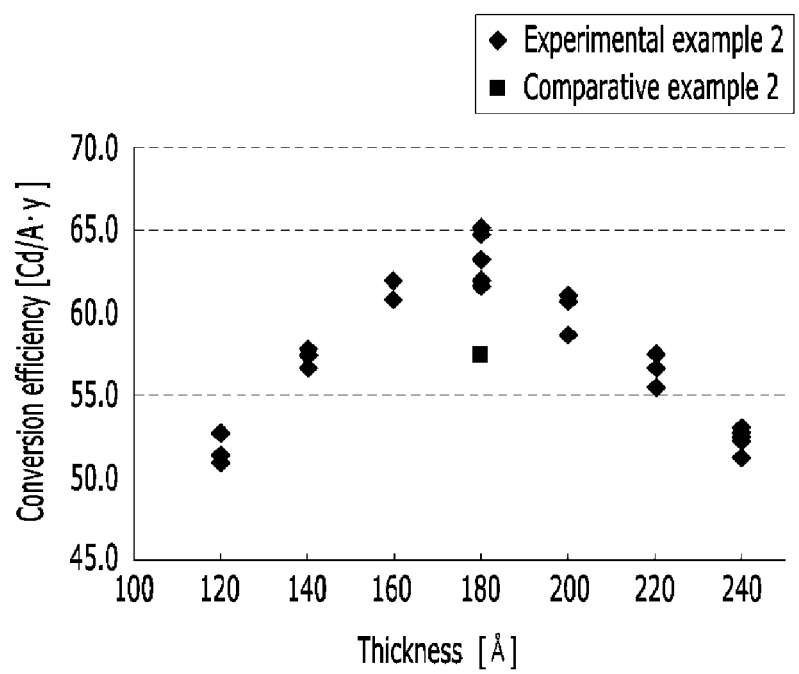
FIG. 10 is a graph showing conversion efficiency depending on the thickness of a hole auxiliary layer.

FIG. 10 is a graph showing conversion efficiency depending on the thickness of a hole auxiliary layer. In FIG. 10, An X-axis represents the conversion efficiency, and a Y-axis represents the thickness of the hole auxiliary layer.

Referring to FIG. 10, experimental example 2 relates to the hole auxiliary layer including the hole blocking layer having in the range of 120 angstroms to 240 angstroms thick, and comparative example 2 relates to the hole auxiliary layer without the hole blocking layer having about 180 angstroms thick. The configurations of the organic light emitting element other than the hole auxiliary layer are the same as in experimental example 2 and comparative example 2.

The conversion efficiency means a value obtained by dividing the current efficiency (Cd/A) by a y color coordinate, which means that the efficiency of the organic light emitting element is excellent when the value of the conversion efficiency is high.

In experimental example 2, when the hole auxiliary layer has in a range of 120 angstroms to 140 angstroms thick and when the hole auxiliary layer has in a range of 220 angstroms to 240 angstroms thick, the conversion efficiency is similar and low compared to comparative example 2. That is, when the hole auxiliary layer has the above thickness, although the hole blocking layer is included, the efficiency of the organic light emitting element may not be improved compared to comparative example 2, in which the hole blocking layer is not included.

According to an exemplary embodiment, the hole auxiliary layer including the hole blocking layer in a range of about 140 angstroms to 220 angstroms thick.

Thickness range of the hole blocking layer and hole transport layer according to an exemplary embodiment and Comparative Example will be described with reference to the Table 1.

TABLE 1

| Thickness (Å) of a hole blocking layer/a hole transport layer/a hole blocking layer | Total thickness (Å) of a hole auxiliary layer | Current efficiency (Cd/A) | Color coordinate (y) | Conversion efficiency (Cd/A · y) |
|---|---|---|---|---|
| Comparative Example 2 | 180 | 2.8 | 0.049 | 57.14 |
| 40/60/40 | 140 | 2.8 | 0.049 | 57.14 |
| 50/40/50 | 140 | 2.8 | 0.048 | 58.33 |
| 30/100/30 | 160 | 3.9 | 0.064 | 60.94 |
| 40/80/40 | 160 | 4.1 | 0.066 | 62.12 |
| 40/100/40 | 180 | 3.3 | 0.050 | 66.00 |
| 50/80/50 | 180 | 3.2 | 0.050 | 64.00 |
| 60/60/60 | 180 | 4.1 | 0.065 | 63.08 |
| 50/100/50 | 200 | 3.1 | 0.051 | 60.78 |
| 60/80/60 | 200 | 3.1 | 0.050 | 62.00 |
| 50/120/50 | 220 | 5.2 | 0.091 | 57.14 |
| 60/100/60 | 220 | 5.2 | 0.090 | 57.78 |
| 70/80/70 | 220 | 5.2 | 0.094 | 55.3 |

First, referring to Table 1, the case in which the hole transport layer is constant at 80 angstroms thick and the hole blocking layer is 40 angstroms, 50 angstroms, 60 angstroms, and 70 angstroms thick will be described.

As shown by the current efficiency and the conversion efficiency depending on the thickness variation of the hole blocking layer described in Table 1, when the thickness of the hole blocking layer is in a range of 40 to 60 angstroms thick, improved conversion efficiency appears compared to the comparative example, however it may be confirmed that the conversion efficiency is deteriorated, and is particularly lower than the conversion efficiency of the comparative example when the thickness of the hole blocking layer has 70 angstroms thick.

Accordingly, the hole blocking layer is in the range of 30 angstroms to 60 angstroms thick according to an exemplary embodiment.

Next, referring to Table 1, the case in which the hole blocking layer has 50 angstroms thick, and the hole transport layer is 40 angstroms, 80 angstroms, 100 angstroms, and 120 angstroms thick will be described.

When the hole blocking layer has constant thick, the characteristic of the current efficiency and the conversion efficiency being different depending on the thickness of the hole transport layer occurs, particularly as the thickness of the hole transport layer is increased to 80 angstroms, 100 angstroms, and 120 angstroms, the conversion efficiency decreases occurs. Specifically, when the hole transport layer is 120 angstroms thick, since the conversion efficiency is the same as the conversion efficiency of the comparative example, the conversion efficiency may be lower than that of the comparative example when the hole transport layer has more than 120 angstroms thick.

Thus, the hole transport layer according to an exemplary embodiment is in the range from 30 angstroms to 120 angstroms thick.

Although the comparative description is not separately listed, the various exemplary embodiments described in Table 1 as the organic light emitting element according to an exemplary embodiment may have improved current efficiency and conversion efficiency compared with the comparative example.

According to an exemplary embodiment, a hole auxiliary layer including a hole blocking layer has 140 angstroms to 220 angstroms thick. Therefore, a organic light emitting element including the hole auxiliary layer may have improved current efficiency and lifespan. Further, a organic light emitting diode display including the organic light emitting element may provide excellent display quality and have improved lifespan.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting element comprising:
    a first electrode;
    a second electrode;
    an emission layer between the first electrode and the second electrode; and
    a hole auxiliary layer between the first electrode and the emission layer,
    wherein the hole auxiliary layer includes:
        at least one hole blocking layer; and
        at least one hole transport layer contacted with the hole blocking layer, and
        wherein a thickness of the hole auxiliary layer is in a range of 140 angstroms to 220 angstroms.

2. The organic light emitting element of claim 1, wherein the hole auxiliary layer includes a multi-layered structure comprising more than three layers, in which the hole blocking layer and the hole transport layer are alternately positioned.

3. The organic light emitting element of claim 1, wherein the hole auxiliary layer includes two hole blocking layers as the at least one hole blocking layer, and the at least one hole transport layer is positioned between the two hole blocking layers.

4. The organic light emitting element of claim 1, wherein the thickness of each of the at least one hole blocking layer is in a range of 30 angstroms to 60 angstroms.

5. The organic light emitting element of claim 1, wherein the thickness of each of the at least one hole transport layer is in a range of 30 angstroms to 120 angstroms.

6. The organic light emitting element of claim 1, wherein an energy level of a highest occupied molecular orbital (HOMO) of the at least one hole blocking layer is lower than the energy level of the highest occupied molecular orbital of the at least one hole transport layer.

7. The organic light emitting element of claim 1, wherein an energy level of the highest occupied molecular orbital of the at least one hole blocking layer is lower than the energy level of the highest occupied molecular orbital of the emission layer.

8. The organic light emitting element of claim 1, wherein an energy level of the highest occupied molecular orbital of the at least one hole blocking layer is higher than the energy level of the highest occupied molecular orbital of the emission layer.

9. The organic light emitting element of claim 1, wherein an energy level of a lowest unoccupied molecular orbital (LUMO) of the at least one hole blocking layer is higher than the energy level of the lowest unoccupied molecular orbital of the emission layer.

10. The organic light emitting element of claim 1, wherein the hole auxiliary layer includes two hole transport layers as the at least one hole transport layers, and the at least one hole blocking layer is positioned between the two hole transport layers.

11. An organic light emitting diode display comprising:
    a substrate;
    a transistor positioned on the substrate; and
    an organic light emitting element connected to the transistor,
    wherein the organic light emitting element includes:
        a first electrode;
        a second electrode;
        an emission layer between the first electrode and the second electrode; and
        a hole auxiliary layer between the first electrode and the emission layer,
    wherein the hole auxiliary layer includes:
        at least one hole blocking layer; and
        at least one hole transport layer contacting the hole blocking layer, and
    wherein a thickness of the hole auxiliary layer is in a range of 140 angstroms to 220 angstroms.

12. The organic light emitting diode display of claim 11, wherein:
    the hole auxiliary layer includes a multi-layered structure comprising more than three layers, in which the hole blocking layer and the hole transport layer are alternately positioned.

13. The organic light emitting diode display of claim 11, wherein the hole auxiliary layer includes two hole blocking layers as the at least one hole blocking layer, and the at least one hole transport layer is positioned between the two hole blocking layers.

14. The organic light emitting diode display of claim 11, wherein:
the thickness of each of the at least one hole blocking layer is in a range of 30 angstroms to 60 angstroms.

15. The organic light emitting diode display of claim 11, wherein:
the thickness of each of the at least one hole transport layer is in a range of 30 angstroms to 120 angstroms.

16. The organic light emitting diode display of claim 11, wherein an energy level of a highest occupied molecular orbital (HOMO) of the at least one hole blocking layer is lower than the energy level of the highest occupied molecular orbital of the at least one hole transport layer.

17. The organic light emitting diode display of claim 11, wherein an energy level of a highest occupied molecular orbital of the at least one hole blocking layer is lower than the energy level of the highest occupied molecular orbital of the emission layer.

18. The organic light emitting diode display of claim 11, wherein an energy level of a highest occupied molecular orbital of the at least one hole blocking layer is higher than the energy level of the highest occupied molecular orbital of the emission layer.

19. The organic light emitting diode display of claim 11, wherein an energy level of a lowest unoccupied molecular orbital (LUMO) of the at least one hole blocking layer is higher than the energy level of the lowest unoccupied molecular orbital of the emission layer.

20. The organic light emitting diode display of claim 11, wherein the hole auxiliary layer includes two hole transport layers as the at least one hole transport layers, and the at least one hole blocking layer is positioned between the two hole transport layers.

* * * * *